United States Patent [19]
Blish, II et al.

[11] Patent Number: 5,907,561
[45] Date of Patent: May 25, 1999

[54] METHOD TO IMPROVE TESTING SPEED OF MEMORY

[75] Inventors: Richard C. Blish, II, Saratoga; David E. Lewis, Sunnyvale, both of Calif.

[73] Assignee: Advanced Micro Devices, Inc., Sunnyvale, Calif.

[21] Appl. No.: 08/992,077

[22] Filed: Dec. 17, 1997

[51] Int. Cl.$^6$ .................................................. G06F 11/00
[52] U.S. Cl. ................................................... 371/21.1
[58] Field of Search ............................... 371/21.1, 21.2, 371/21.3, 21.4, 21.6; 365/230.05, 200, 189.07

[56] References Cited

U.S. PATENT DOCUMENTS 5,706,234  1/1998  JPilch, Jr. et al. ...................... 371/21

Primary Examiner—Vincent P. Canney
Attorney, Agent, or Firm—H. Donald Nelson

[57] ABSTRACT

A method of testing a semiconductor memory device using a parallel march pattern method of testing. All of the memory bits in a memory device are programmed to a first logic state. All of the memory bits in selected rows are programmed to a second logic state. All of the memory bits in rows adjacent to the rows programmed to the second logic state are read to determine if the memory bits programmed to the second logic state have caused the memory bits programmed to the first logic state in the adjacent rows to change logic state. The selected rows are determined by a periodicity value that can be values such as 4, 8, or 16. The periodicity determines the number of clock cycles needed to test the entire memory device. A periodicity of 8 requires only 8 clock cycles to test the entire memory device, regardless of the size of the memory device. The parallel march pattern method of testing can be by rows, by columns or by diagonals.

3 Claims, 4 Drawing Sheets

```
                                                                      ┌─ 100
                             ┌108
                      104╲  ┌106
STEP 0    102 → 11111111  00000000  00000000  00000000  • • •  00000000
                   ┌118    ┌120
STEP 1    110 → 01111111  10000000  00000000  00000000  • • •  00000000
          114╯            └116
STEP 2    122 → 00111111  11000000  00000000  00000000  • • •  00000000
              126╯ 130╲124  └132
  •                         128
  •
STEP *          00000000  00000000  00000000  00000000  • • •  0 11111111
  *Total steps needed = Number of Bits - 8                      └─ 134
```

FIGURE 1 (PRIOR ART)

```
                          ┌─── 204 ───┐      ┌─── 204 ───┐
   ┌─ 202
 0  Step 0    00000000  00000000  00000000  00000000  00000000  00000000
 1  Step 1    11111111  11111111  11111111  11111111  11111111  11111111
 2  Step 2    00000000  00000000  00000000  00000000  00000000  00000000
 3  Step 3    00000000  00000000  00000000  00000000  00000000  00000000
 4  Step 4    00000000  00000000  00000000  00000000  00000000  00000000
 5  Step 5    00000000  00000000  00000000  00000000  00000000  00000000
 6  Step 6    00000000  00000000  00000000  00000000  00000000  00000000
 7  Step 7    00000000  00000000  00000000  00000000  00000000  00000000
 8  Step 0    00000000  00000000  00000000  00000000  00000000  00000000
 9  Step 1    11111111  11111111  11111111  11111111  11111111  11111111   206
10  Step 2    00000000  00000000  00000000  00000000  00000000  00000000
11  Step 3    00000000  00000000  00000000  00000000  00000000  00000000
12  Step 4    00000000  00000000  00000000  00000000  00000000  00000000
13  Step 5    00000000  00000000  00000000  00000000  00000000  00000000
14  Step 6    00000000  00000000  00000000  00000000  00000000  00000000
15  Step 7    00000000  00000000  00000000  00000000  00000000  00000000
16  Step 0    00000000  00000000  00000000  00000000  00000000  00000000
17  Step 1    11111111  11111111  11111111  11111111  11111111  11111111   206
18  Step 2    00000000  00000000  00000000  00000000  00000000  00000000
19  Step 3    00000000  00000000  00000000  00000000  00000000  00000000
```

FIGURE 2

METHOD TO IMPROVE TESTING SPEED OF MEMORY

BACKGROUND OF THE INVENTION

1. Field of the Invention

This invention relates generally to methods of testing semiconductor memory devices. More specifically, this invention relates to a method of testing semiconductor memory devices that utilizes parallel march patterns that substantially increase testing speed.

2. Discussion of the Related Art

The rapid growth of technological requirements and the worldwide acceptance of sophisticated electronic device have created an unprecedented demand for large-scale, complex, integrated circuits. Meeting these demands has required technological advances in materials and processing equipment and a significant increase in the number of individuals involved in integrated circuit design and testing. In addition, there has been an increased emphasis on effectively utilizing sophisticated test instruments and procedures to aid in the analysis of the manufacturing parameters so that the design and manufacturing process can be improve and in the testing of semiconductor devices before the devices are shipped to customers.

In order to meet the increasing demand, there has been an ever-increasing requirement to increase the density of devices manufactured in a semiconductor device. The number of devices manufactured on a chip exceeded the generally accepted definition of VLSI (very large scale integration) of more than 100,000 devices per chip in the mid-1970s. By 1986, this number of devices manufactured on a chip had grown to over 1 million devices per chip. As is well known, today the number of devices per chip is well over 1 million devices per chip and is still growing at an exponential rate.

To keep up with the growing demand for technological growth, there has been a concomitant demand for a growth in the size of memory devices. Large memory devices are one of the keys to the continued growth of technology. Memory devices have grown dramatically with some memory devices being manufactured with multiple millions of memory bits. It is the practice and a requirement of the semiconductor industry to test each memory bit in the memory device before it is sent to a customer. One current method of testing memory is known as the serial march method of testing. In this method, a selected number of consecutive memory bits are programmed logic high and adjacent logic low memory bits are read to determine if they have changed state due to leakage or a short from the programmed logic high memory bits. The selected number of memory bits is moved one bit and the reading of the adjacent logic low memory bits is repeated. This process continues until the entire memory device has been tested. As can be appreciated, the number of clock cycles needed to test the memory device is approximately equal to the number of memory bits in the memory device. For example, a memory device having 1 million memory bits would require approximately 1 million clock cycles to completely test the memory device. As the memory devices have grown, the number of required clock cycles to test has grown at the same pace.

While the time to test a memory device completely has increased, at the same time the price of the memory devices has decreased. The decease in the selling price of the memory devices has caused increased pressure upon the testing facility to decrease the cost of testing.

Therefore, what is needed is a method to test memory devices that is rapid, cost effective, and thorough.

SUMMARY OF THE INVENTION

According to the present invention, the foregoing and other objects and advantages are attained by a parallel march pattern method of testing semiconductor memory devices. In a memory device, all memory bits are programmed to a first logic state (logic low), all of the memory bits in selected rows of memory bits are programmed to a second logic state (logic high). Adjacent rows of memory bits are then read to determine if the logic high programmed memory bits have affected the logic state of the adjacent logic low memory bits. The number of rows of memory bits that are programmed high is determined by a design-specific periodicity value. The periodicity value can be a value such as 4, 8, or 16. The selected periodicity value determines the number of clock cycles that is required to completely test the memory device. If the periodicity value were 8, there will be required 8 clock cycles to completely test the memory device. After each row is programmed to logic high and adjacent rows checked, the next row is programmed to logic high and adjacent rows checked. This continues until all rows determined by the periodicity value have been checked.

In another aspect of the present invention, the parallel march pattern method of testing can be done by columns. All the memory bits in the device are programmed to a first logic state (logic low) and all the memory bits in selected columns are programmed to a second logic state (logic high). Then all the memory bits in adjacent columns are read to determine if the logic high memory bits have changed the logic state of any of the adjacent logic low memory bits. In a similar manner as that described for the parallel march pattern method of testing by rows, the number of clock cycles required to test the complete memory device by the parallel march pattern method of testing by columns is determined by the periodicity value. The periodicity value selected for the parallel march pattern done by columns can be a different value or it can be the same value as that selected for the parallel march pattern method of testing by rows.

In still another aspect of the present invention, the parallel march pattern method of testing can be done by diagonals where all the memory bits in the device are programmed to a logic low state, all the memory bits in selected diagonals are programmed to a logic high state, and then all the memory bits in adjacent diagonals are read to determine if the logic high memory bits have changed the logic state of any of the adjacent logic low memory bits.

The method of the invention allows a large semiconductor memory device to be completely tested using a small number of clock cycles. A 1 Mbit memory device can be tested in one direction in 4, 8, or 16 clock cycles whereas the prior art method requires approximately 1 million clock cycles. The 1 Mbit memory can be tested in four directions and if a periodicity of 8 were used, the total required number of clock cycles would be 32 clock cycles.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

FIG. 1 illustrates a prior art method of testing a memory device using a serial march pattern;

FIG. 2 illustrates a method of testing a memory device by row using a parallel march pattern in accordance with the present invention;

DETAILED DESCRIPTION

Figure 3:
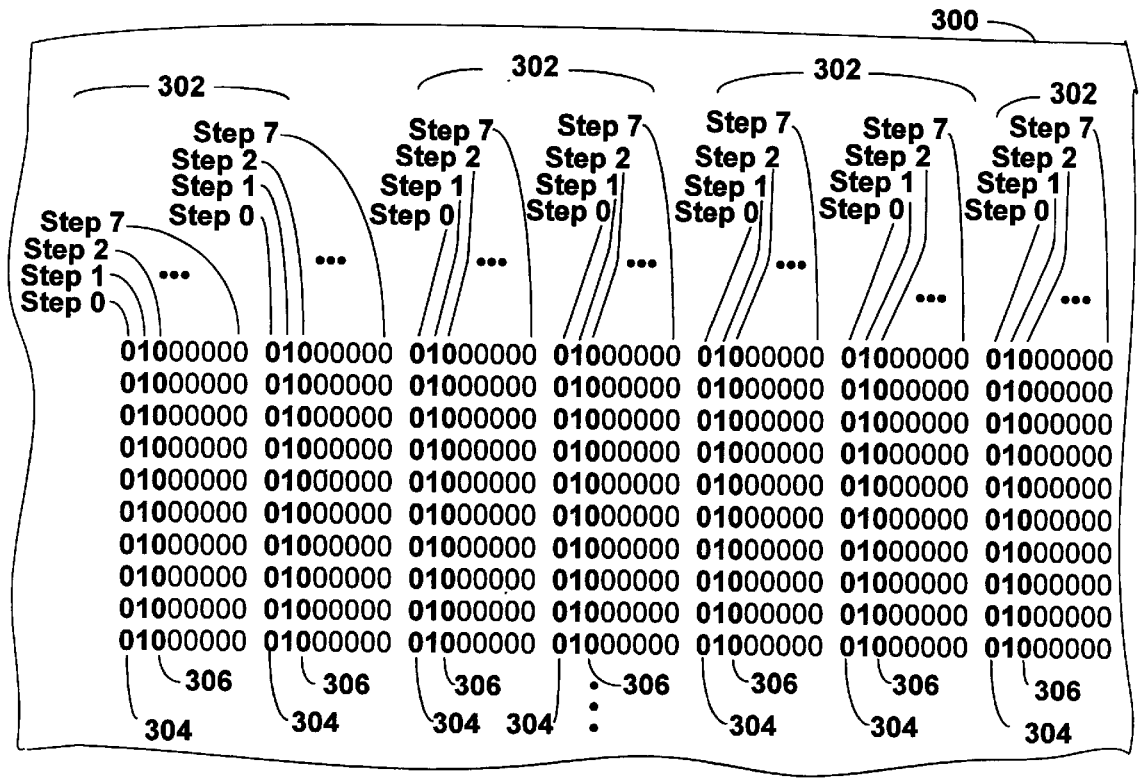
FIG. 3 illustrates a method of testing a memory device by column using a parallel march pattern in accordance with the present invention.

Reference is now made in detail to a specific embodiment of the present invention that illustrates the best mode presently contemplated by the inventors for practicing the invention.

FIG. 1 illustrates the method of testing a semiconductor memory device using the serial march pattern of testing currently used in the semiconductor art. FIG. 1 shows a portion 100 of a semiconductor memory device. A row of individual memory bits is shown at 102 with each of the first 8 consecutive memory bits programmed to logic one as shown at 104. The first step, indicated as Step 0 in FIG. 1, of the serial march pattern method of testing is to program all of the memory bits to a first logic state. Then the first selected number of consecutive memory bits is programmed to a second logic state. When the selected number of memory bits have been programmed to the second logic state, the surrounding memory bits that were programmed to a logic low, such as the memory bit at 106 are read to determine if any of the surrounding memory bits have changed logic state. The next step, indicated as Step 1 in FIG. 1, of the serial march pattern method of testing is shown at 110, which shows the same row of individual memory bits that is shown at 102. The selected number of consecutive memory bits programmed to a second logic state is moved one bit to the right as shown at 112. The surrounding memory bits that were programmed to a first logic state, such as the memory bits at 114 and 116, are read to determine if any of the memory bits that were programmed to a second logic state, specifically the memory bits at 118 and 120, respectively, have caused a change of logic state of any of the surrounding memory bits. The next step, indicated as Step 2 in FIG. 1, of the serial march pattern method of testing is shown at 122 where the same row of individual memory bits as shown at 102 and 110 is shown. The selected number of memory bits programmed to a second logic state is moved one bit to the right as shown at 124 and the memory bits at 126 and 128 are read to determine if the memory bits at 130 and 132, respectively have caused a change in the logic state of the memory bits at 126 and 128. These steps are repeated until all individual memory bits in the memory device have been tested, with the last bit tested being the memory bit indicated at 134. As can be appreciated by a person of ordinary skill in the art, the memory bits programmed to a second logic state are moved a bit at a time until all the memory bits in the first row are tested, the memory bits programmed to a second logic state then "wrap around" to the next row. This serial march pattern repeats until all of the memory bits in each row are tested. The total number of steps needed to test the memory device is equal to the total number of bits minus eight (assuming that the number of consecutive memory bits programmed to a second logic state is eight). It should be noted that the method could include another number of consecutive memory bits being programmed to a second logic state, such as a nibble (four bits), a word (16 bits), etc. If the device is a 1 Mbit memory device, the serial march method of testing done by moving a single consecutive number of memory bits completely through the memory device would take approximately 1 million clock cycles. The actual number of required clock cycles would be the number of memory bits minus the number of memory bits programmed to the second logic state. For example, for the 1 Mbit memory device, if the number of memory bits programmed to a second logic state were 8, the actual number of clock cycles required to test the 1 Mbit memory device would be $2^{20}=1,048,576-8=1,048,568$ clock cycles. It is noted that it is standard practice in the semiconductor art to refer to a memory device having $2^{20}$ bits as a 1 Mbit device even though $2^{20}$ is actually equal to 1,048,576.

FIG. 2 illustrates the parallel march pattern method of testing a semiconductor memory device by row in accordance with the present invention. FIG. 2 shows a portion 200 of a semiconductor memory device and it is noted that the portion 200 of the semiconductor memory device shown in FIG. 2 could be the same memory device as that shown in FIG. 1. In FIG. 2 there are shown 19 rows of memory bits with the number of the row being indicated at the column indicated at 202. Each row is shown with 6 columns of 8 memory bits each (a Byte) with each Byte being separated by a space. The separation is for convenience only and the Bytes may not necessarily be separated on the semiconductor device. The columns extend from the top of the page to the bottom of the page and are indicated at 204. The actual width of a semiconductor memory varies and may be 4 bytes wide (32 bits), 8 bytes wide (64 bits), 16 bytes wide (128 bits), etc. In the parallel march pattern method of testing, the actual width of the memory device does not affect the time required complete the test. Programming all of the memory bits in the device to a first logic state starts the parallel march pattern of testing by row. All of the memory bits in selected rows are programmed to a second logic state and each memory bit in rows adjacent to the rows that have been programmed to a second logic state are read to determine if there has been any change of logic state in any of the adjacent rows of memory bits. The memory bits surrounding the memory bits programmed to a second logic state are in the rows above and below the row at the second logic state. The reading of the surrounding memory bits is done with existing circuitry. If any of the surrounding memory bits have changed state, the memory device would be considered defective. The change of logic state in one of the adjacent memory bits would indicate that the particular surrounding bit is either directly shorted to one of the memory bits programmed to a second logic state or that there is not sufficient electrical isolation between the memory bits involved. In the parallel march pattern of testing, the selected rows that are programmed to a second logic state have a selected periodicity, that is, every $n^{th}$ row is programmed to the second logic state. The periodicity could be determined by a structural consideration such as "seams" in the memory device that could be due to contacts that are shared by each memory bit. These shared contacts could be contacts to power supplies, clock signals, word lines or bit lines. The memory device shown in FIG. 2 is shown having a periodicity of eight, which means that every eighth row would be programmed to the second logic state. The dashed lines 206 indicate that there is a seam adjacent to every eighth row. FIG. 2 shows that all of the memory bits in rows 1, 9, and 15 have been programmed to a second logic state, in this case the second logic state is indicated as a 1. By extension, it should be appreciated that all of the memory bits in equivalent rows determined by the periodicity in the entire memory device are programmed to logic one. The first step in the parallel march pattern of testing by rows is to program all of the memory bits in the device to a logic 0 and then to program all the memory bits in rows (n+am) to logic 1, where a=the periodicity, $n=0 \rightarrow (a-1)$ and $m=1 \rightarrow$(number of rows–a). For example, for a 1 Mbit memory device (1,048,576 memory bits) having an equal number rows and columns, the number of rows is 1024 rows. If the periodicity a=8, m varies from $1 \rightarrow (1024-8)=1016$ and n varies from 0 to 7. After all the memory bits in rows (n+am) have been programmed to logic 1, all of the memory bits in rows (n+am)±1 are read to determine if there has been a change of state caused by a leakage of charge from any of the programmed logic 1 memory bits to any of the surrounding logic 0 memory bits. Referring again to FIG. 2, all of the memory bits in rows 1, 9, 15 . . . have been programmed to logic 1. All of the memory bits in rows 0 and 2, 8 and 10, 16 and 18 are read to determine if there has been a change of state caused by charge leakage. The next step, Step 2, would be to increase n by 1 and if n is not =a−1, program all of the memory bits in the next row to a logic one, and read the surrounding memory bits. This procedure is continued until n=a−1. This means that the entire memory device in this example can be tested by row from top to bottom in 8 clock cycles rather than the 1,048,569 clock cycles required for the serial march pattern discussed above in conjunction with FIG. 1. In addition, it should be understood that the parallel march pattern of testing could be conducted from the bottom to the top of the memory as shown in FIG. 1. In some cases, it may be desirable to test the memory device in both directions. Because the number of clock cycles would be the same going from bottom to top as from top to bottom, the memory device can be completed tested in both directions in 16 clock cycles.

FIG. 3 illustrates the parallel march pattern method of testing a semiconductor memory device by column in accordance with the present invention. FIG. 3 shows a portion 300 of a semiconductor memory device and it is noted that the portion 300 of the semiconductor memory device shown in FIG. 3 could be the same memory device as the one shown in FIGS. 1 and 2. In FIG. 3 there are shown seven columns of memory bits, each column having eight memory bits. As discussed above, each eight memory bits is separated by a space, which may not be the case in the actual device. The parallel march pattern method of testing by column is the same as the parallel march pattern method of testing by row discussed above in conjunction with FIG. 2. FIG. 3 illustrates the case when all the memory bits in the device are initially programmed to logic 0 and then all of the memory bits in the bit columns indicated by Step 1 at 302 are programmed to logic one. After the bit columns indicated by Step 1 are programmed to logic one, all of the memory bits in the bit columns, indicated by 304 and 306 are read to determine if there has been a charge leakage to any of the memory bits surrounding the programmed logic 1 memory bits. The next step, Step 2, is to program the bit columns to logic one and to read all of the surrounding memory bits. This procedure is repeated until all of the bit columns have been programmed to logic one and all of the memory bits in the surrounding bit columns have been read to determine if there has been any charge leakage from the programmed logic 1 memory bits to any of the surrounding logic 0 memory bits. In the case of the parallel march pattern method of testing by column, the same equations are used as for the calculations for the parallel march pattern method of testing by row. In the case of the parallel march pattern of testing by column, if it is assumed that the periodicity a=8 and that the number of columns=1024 bits, $n=0 \rightarrow 7$ [a−1] and $m=1 \rightarrow 1016$ [number of columns–a]. The total number of clocks needed to test the entire device by the parallel march pattern method of testing by column is again 8 clocks rather than the 1,048,568 clock cycles needed for the serial march pattern of the prior art. In a similar manner as that discussed above in conjunction with the parallel march pattern method of testing by row in FIG. 2, the parallel march pattern method of testing by column can be conducted from left to right in 8 clocks and repeated from right to left in an additional 8 clocks. Therefore, the memory device can be tested in four directions, that is, from top to bottom, from bottom to top, from left to right, and from right to left in 32 clocks.

Figure 4:
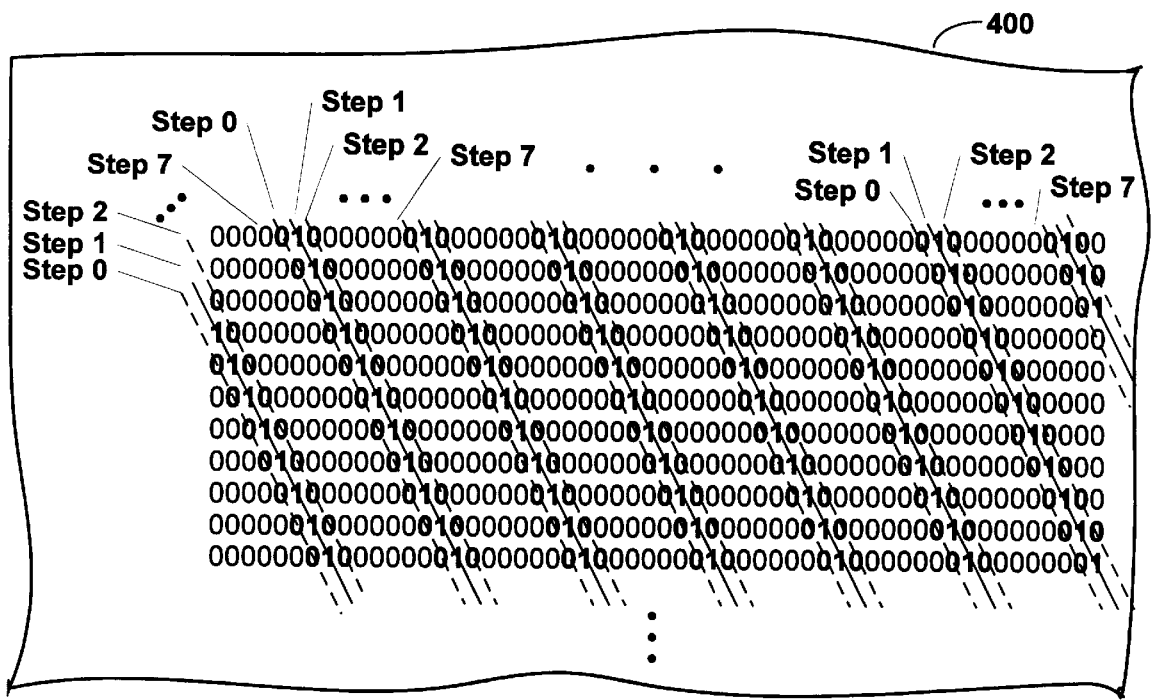
FIG. 4 illustrates a method of testing a memory device by diagonal using a parallel march pattern in accordance with the present invention.

FIG. 4 illustrates the parallel march pattern method of testing a semiconductor memory device by diagonals in accordance with the present invention. FIG. 4 shows a portion 400 of a semiconductor memory device and it is noted that the portion 400 of the semiconductor memory device shown in FIG. 4 could be the same memory device as the one shown in FIGS. 2–3. The parallel march pattern method of testing by diagonals can be conducted with different diagonals. That is, the diagonal could be selected to be at a 45° angle or the diagonal could be selected to be at a different angle, such as 60° or 30°. For the example shown in FIG. 4 the same method of testing is used as discussed above in conjunction with FIGS. 2 & 3. All of the memory bits in the memory device are originally programmed to logic 0 and all the memory bits in selected diagonals are programmed to logic one. All of the memory bits in the diagonals adjacent to the programmed logic 1 diagonals are read to determine if there has been any charge leakage from the logic 1 memory bits to the logic 0 memory bits. Depending upon the angle of the diagonal and the periodicity, the number of clocks required to test the memory device in a diagonal direction would be the same or close to the same number of clocks for either the parallel march pattern method of testing by row or the parallel march pattern method of testing by column as discussed above.

Figure 5:
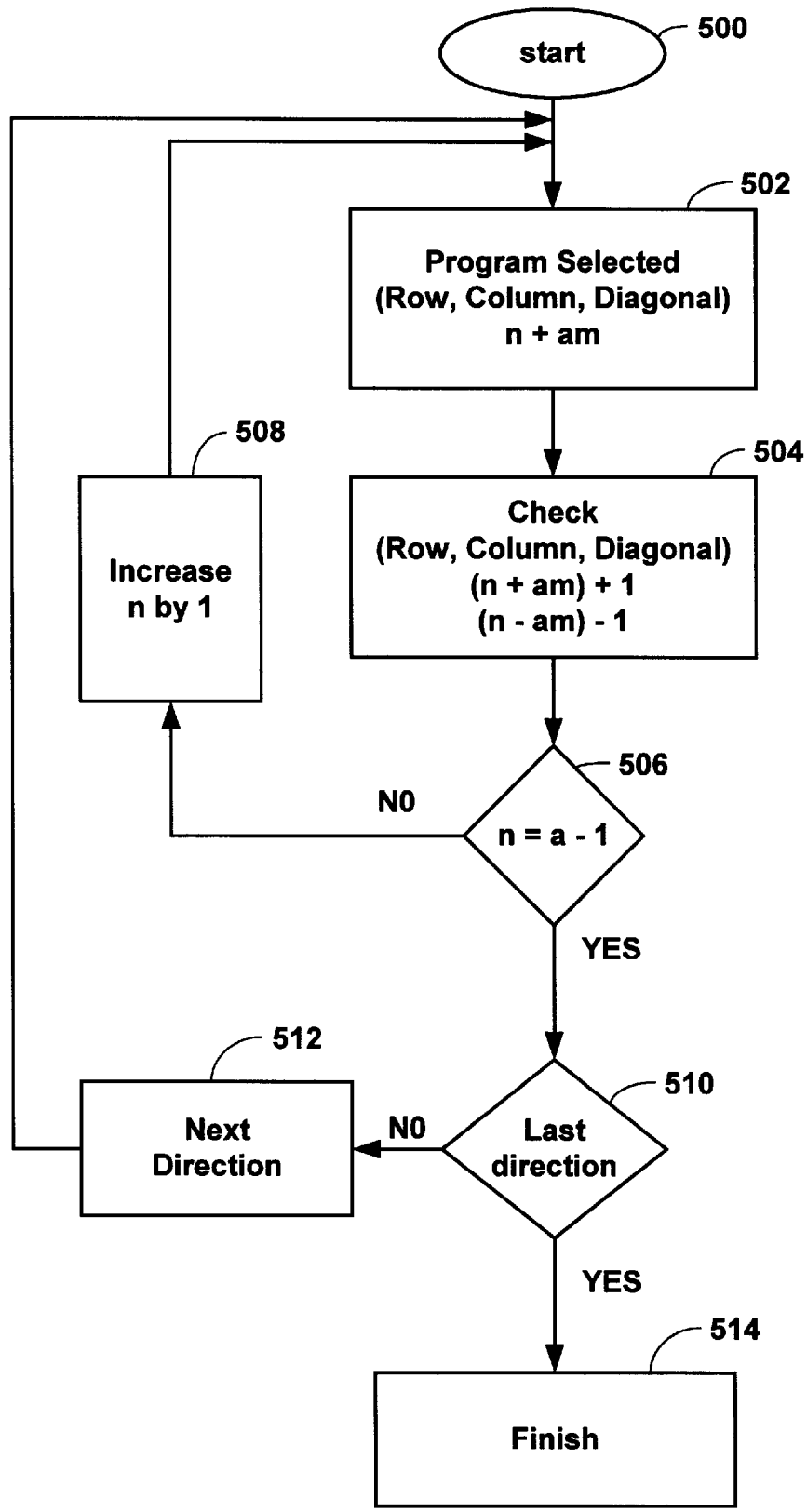
FIG. 5 is a flow diagram showing the method of testing a memory device in accordance with the present invention.

FIG. 5 is a flow diagram showing the method of testing a memory device in accordance with the present invention. The test procedure starts at 500 and a first parallel march pattern method of testing is selected at 502. The first parallel march pattern method of testing can be a parallel march pattern method of testing by row either from top to bottom or bottom to top. The parallel march pattern method of testing by column either from right to left or from left to right or a parallel march pattern by diagonal in one of the several directions available can also be selected. If a first parallel march pattern method of testing by row is selected, after all of the memory bits in the memory device have been programmed to a logic 0, rows (n+am) of memory bits are programmed to logic 1. As discussed above, a=the selected periodicity, $n=0 \rightarrow (a-1)$ and $m=1 \rightarrow$(number of rows–a). The surrounding memory bits are checked at 504 by "reading" the memory bits to determine if charge has leaked to the logic 0 memory bits. The rows (n=am)±1 are read when the parallel march pattern method of testing by row is selected. If the parallel march pattern method of testing by column has been selected the column (n+am) of memory bits is programmed to logic 1 and the columns (n+am)±1 are read to determine if charge has leaked from the logic 1 memory bits. At 506 it is determined if the last row determined by the periodicity has been checked, that is, if n=a−1. If not, n is increased by 1, as indicated at 508 and the procedure continues with the new rows being programmed and checked as described above. If the last row has been programmed and checked, it is determined at 510 if the last direction has been tested. If not, the next direction is selected at 512 and the test method of the present invention is done for the new direction (column right, column left, row up, row down, or one of the diagonals). If all of the desired directions have been tested, the test is finished as indicated at 514.

Figure 6A:
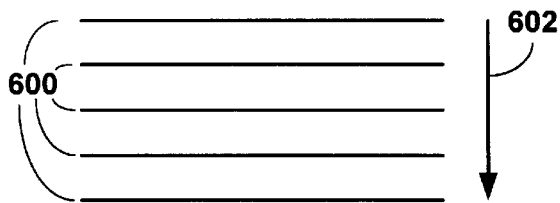
FIGS. 6A–6H illustrate a more complete complement of possible parallel march patterns.
Figure 6B:
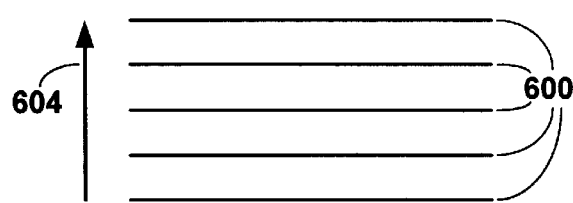
Figure 6C:
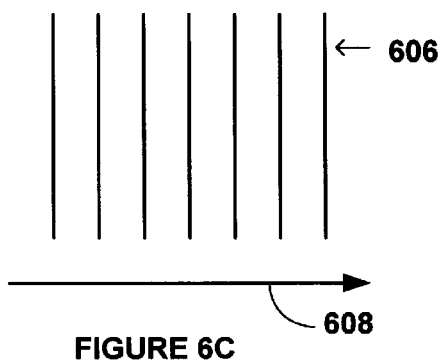
Figure 6D:
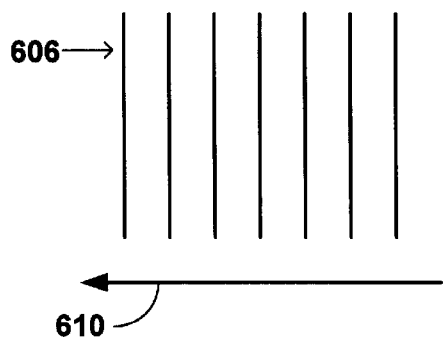
Figure 6E:
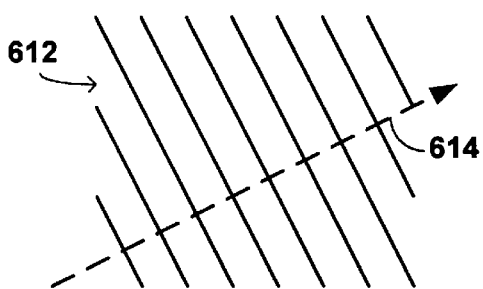
Figure 6F:
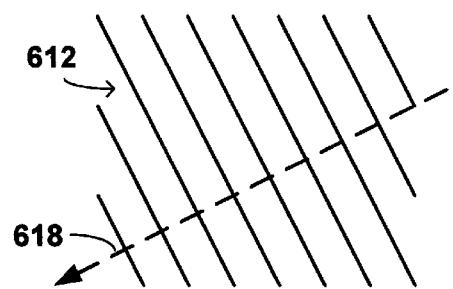
Figure 6G:
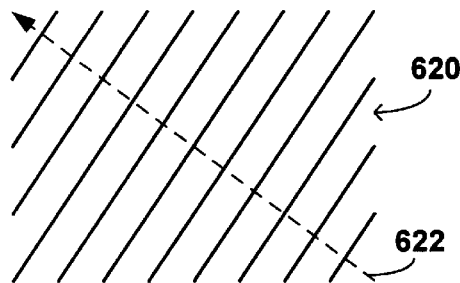
Figure 6H:
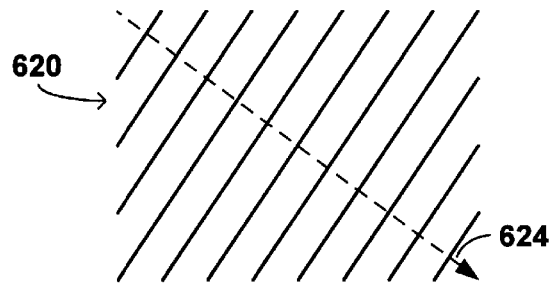

Referring to FIGS. 6A–6H there is shown examples of the various directions the parallel march pattern method of testing in accordance with the present invention can entail. FIG. 6A indicates the parallel march pattern method of testing by rows. The rows are indicated at 600 and the test is conducted from top to bottom as indicated by the arrow 602. FIG. 6B indicates the parallel march pattern method of testing by rows with the test conducted from bottom to top as indicated by the arrow 604. FIG. 6C indicates the parallel march pattern method of testing by columns. The columns are indicated at 606 and the test is conducted from left to right as indicated by the arrow 608. FIG. 6D indicates the parallel march pattern method of testing by columns with the test conducted from right to left as indicated by the arrow 610. FIG. 6E indicates the parallel march pattern method of testing diagonals. The diagonals are indicated at 612 and the test is conducted in the direction indicated by the arrow 614. FIG. 6F indicates the test being conducted on the diagonals 612 as shown in FIG. 6E with the tests being conducted in the direction indicated by the arrow 618. FIGS. 6G & 6H indicate an alternative parallel march pattern method diagonals. The diagonals are indicated at 620 and the two test directions are indicated by the arrows 622 and 624.

The foregoing description of the embodiments of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of testing semiconductor memory devices having memory bits organized in rows and columns, wherein the method comprises:

programming all memory bits in the memory device to a first logic state;

programming all memory bits in rows $n+a_1m_1$ to a second logic state, where $a_1$ is equal to a first selected periodicity, n varies from $0 \rightarrow (a_1-1)$ where 0 is the first row, and $m_1$ varies from $1 \rightarrow$(number of rows-$a_1$);

reading all memory bits in rows $(n+a_1m_1)\pm 1$ to determine if any of the memory bits in rows $(n+a_1m_1)\pm 1$ have changed state from the first logic state;

incrementing n by 1 if n is less than $a_1$; and continue testing until $n=a_1-1$.

2. The method of testing semiconductor memory devices as in claim I further comprising:

programming all of the memory bits in the memory device to the first logic state;

programming all of the memory bits in columns $n+a_2m_2$ to a second logic state, where $a_2$ is equal to a second selected periodicity, n varies from $0 \rightarrow (a_2-1)$ where 0 is the first column, and $m_2$ varies from $1 \rightarrow$(number of columns-$a_2$);

reading all memory bits in columns $(n+a_2m_2)\pm 1$ to determine if any of the memory bits in columns $(n+a_2m_2)\pm 1$ have changed from the first logic state;

incrementing n by 1 if n is less than $a_2$; and continue testing until $n=a_2-1$.

3. The method of testing semiconductor memory devices as in claim 2 further comprising:

programming all of the memory bits in the memory device to the first logic state;

programming all of the memory bits in diagonals $n+a_3m_3$ to a second logic state, where $a_3$ is equal to a third selected periodicity, n varies from $0 \rightarrow (a_3-1)$ where 0 is the first diagonal, and $m_3$ varies from $1 \rightarrow$(number of diagonals-$a_3$);

reading all memory bits in diagonals $(n+a_3m_3)\pm 1$ to determine if any of the memory bits in diagonals $(n+a_3m_3)\pm 1$ have changed from the first logic state;

incrementing n by 1 if n is less than $a_3$; and continue testing until $n=a_3-1$.

\* \* \* \* \*